United States Patent [19]
Whitehead

[11] Patent Number: 5,164,033
[45] Date of Patent: Nov. 17, 1992

[54] ELECTRO-CHEMICAL ETCH DEVICE

[75] Inventor: Lorne A. Whitehead, Vancouver, Canada

[73] Assignee: TIR Systems Ltd., Burnaby, Canada

[21] Appl. No.: 726,895

[22] Filed: Jul. 8, 1991

Related U.S. Application Data

[63] Continuation-in-part of Ser. No. 510,135, Apr. 17, 1990.

[51] Int. Cl.⁵ ............................................. H01L 21/00
[52] U.S. Cl. .................................... 156/345; 156/639; 156/901; 204/129.25; 204/129.43; 204/129.4; 204/211
[58] Field of Search ............... 156/901, 902, 345, 639; 204/129.1, 129.25, 129.6, 129.43, 211, 129.4

[56] References Cited

U.S. PATENT DOCUMENTS

| | | |
|---|---|---|
| 2,037,633 | 4/1936 | Kelvie . |
| 2,404,948 | 7/1946 | Croco . |
| 3,239,441 | 3/1966 | Marosi . |
| 3,301,776 | 1/1967 | Hughes . |
| 3,372,099 | 3/1968 | Clifford . |
| 3,740,519 | 6/1973 | O'Connor . |
| 3,926,767 | 12/1975 | Brendlinger et al. . |
| 4,176,035 | 11/1979 | Pedone . |
| 4,517,045 | 5/1985 | Beckett . |
| 4,533,444 | 8/1985 | Oda et al. . |
| 4,735,678 | 4/1988 | Mandigo et al. . |
| 4,767,489 | 8/1988 | Lindner . |
| 4,820,390 | 4/1989 | Schuster . |
| 4,902,389 | 2/1990 | Nishino et al. . |
| 4,919,774 | 4/1990 | Minato et al. . |

FOREIGN PATENT DOCUMENTS

| | | |
|---|---|---|
| 63-300590 | 12/1988 | Japan . |
| 1442341 | 5/1987 | U.S.S.R. . |

Primary Examiner—David A. Simmons
Assistant Examiner—George A. Goudreau
Attorney, Agent, or Firm—Barrigar & Oyen

[57] ABSTRACT

An electro-chemical etch device for selectively removing material from an electrically conductive surface. At least two electrodes are each at least partially immersed in an electrically conductive fluid and aligned across the surface, proximate to corresponding regions of the surface. A mechanism is provided to move the surface through the fluid, past the electrodes, transversely to the direction of alignment of the electrodes. A control mechanism electrically coupled between the electrodes and the surface controls electrical current flow into or out of the fluid at each of the electrodes. The conductive surface and the conductive fluid are selected such that the rate of material removal at any point on the conductive surface is substantially dependent upon the surface density of electrical current flow into or out of the fluid at that point.

22 Claims, 4 Drawing Sheets

ELECTRO-CHEMICAL ETCH DEVICE

REFERENCE TO RELATED APPLICATION

This is a continuation-in-part of U.S. application Ser. No. 07/510,135 filed Apr. 17, 1990.

FIELD OF THE INVENTION

This invention relates to the manufacture of patterned conductive surfaces, as are typically found in printed circuit boards and in certain packaging materials employing metallic films; and, more particularly, to an electronically controlled electro-chemical etch device for creating such patterns in conductive surfaces.

BACKGROUND OF THE INVENTION

There are many applications for patterned conductive surfaces. Two well known examples are printed circuit boards as used in the electronics industry, and patterned aluminum films on polyester sheet, as often used in the food packaging industry. In these and other similar applications, there is a well known manufacturing technique for mass producing the desired pattern. This technique begins with a layer of metal which is bonded to a sheet of substrate material. A resist material is deposited onto the electrically conductive metal surface by some means, in the same patterned locations as it is desired to have metal in the final pattern. The sheet is then immersed in a suitable etchant solution which has the property that it dissolves the exposed conductive surface off of the substrate, but does not dissolve the substrate, and also does not dissolve the resist material or penetrate the resist material to dissolve the metal underlying the resist material. Finally, if desired, a different etchant can be used to dissolve the resist material, leaving behind the final desired pattern in the metal layer.

A number of different methods can be used to produce the desired resist pattern, but all suffer from several disadvantages. One problem is that the production of the pattern on the resist material constitutes a completely different process from the subsequent removal of the undesired metal. Further disadvantages include the fact that many of the more economical means of producing a resist pattern, such as conventional silk screen, lithographic, or rotogravure printing techniques, involve substantial initial cost for producing a given pattern, and are therefore economical only in large quantity production of a given individual pattern. Other printing techniques, such as optical exposure of photoresist, or computer controlled ink jet printing, suffer from high equipment cost, mechanical complexity, slow processing speed, or a combination of these difficulties.

U.S. Pat. No. 4,517,045 issued May 14, 1985 for an invention of Donald E. Beckett entitled "Apparatus for Formation of Packaging Material" teaches, in an automated system, a means of producing patterns in thin film aluminum on polyester substrates. This is an example of the aforementioned economical resist production technique having high initial cost for preparing a specific resist pattern.

U.S. Pat. No. 4,767,489 issued Aug. 30, 1988 for an invention of Frederick H. Lindner entitled "Computer Aided Printer - Etcher" provides an example of an automated system for producing a desired pattern in copper layers on printed circuit boards. This patent is exemplary of a low cost technique for preparing a specific resist pattern, but having slow production rate and high equipment cost.

The foregoing examples of producing patterned conductive surfaces suffer from the cost and complexities of requiring the introduction of a resist material prior to chemical etching. The present invention provides an apparatus having an array of etching electrodes which directly produce the desired pattern on a conductive surface, without the use of a chemical resist, and therefore without the need to remove the chemical resist after etching has taken place.

Some prior art electro-chemical etching and electro-chemical machining processes use electrodes to directly etch patterns on metal-bearing substrates. This does not require a chemical resist, and therefore does not require post-etching removal of such resist. However, unlike the present invention, these prior art processes typically involve the etching of material which remains stationary relative to the electrodes, rather than undergoing continuous motion while etching occurs. If the material moves, then the etching effect of the electrode(s) must be synchronized to such motion in order to leave a desired two dimensional distribution of residual metal on the substrate. The present invention synchronizes variations in the electrode current with the motion of the substrate to remove a desired pattern of metal from the substrate. That is, the electrode current is varied as a function of time, as determined by the particular predetermined etching pattern desired, and by the instantaneous position of the moving substrate.

In a conventional electro-chemical etching process a piece of metal is immersed in an electrolyte bath. A substantially uniform electrical potential is applied to the metal relative to the electrolyte, which is at a different substantially uniform electrical potential (usually ground potential). The electrical potential difference between the metal and the electrolyte, which determines the etching effect, is therefore uniform as well, and hence the electro-chemical effect on the metal is uniform over the entire piece of metal, or large regions thereof. The present invention creates a spatially variable electro-chemical etch effect across the width of the metal surface. Normally, this would be viewed as impossible, as the metal, being an excellent conductor, must have a substantially uniform electrical potential. However, a variable etch effect is possible, as disclosed by the present inventor, because the electrolyte, being a very weak conductor relative to the metal, can support a substantially varying spatial distribution of electrical potential.

By suitably varying the potential of each one of a series of electrodes aligned across, but not in contact with, the metal substrate, the invention is able to cause the electrolyte to have substantially varying electrical potential as a function of position. This causes varying potential differences between the metal and the electrolyte, and hence different etch effects on the metal regions beneath each electrode.

The invention employs a unique insulator configuration to restrict the etch effect to the region beneath the electrode array, thus preventing undesirable spreading of the etching effect. By moving the metal-bearing substrate transversely to the direction in which the electrodes are aligned, and by controlling the potential of each electrode in synchronization with movement of the substrate, the invention is able to achieve any desired two dimensional pattern of removal of metal from the substrate, leaving an arbitrary, non-uniform metal pattern of any desired shape on the substrate.

Some prior art electro-chemical etching processes employ one or more electrodes, each of which extends across the full width of a moving metal substrate which is to be etched. Each such electrode acts on the full width of the substrate. Such electrodes can only etch a uniform pattern. The present invention employs a multiplicity of electrodes aligned across the substrate, transversely to the direction in which the substrate moves. The width of each electrode is much less than the width of the substrate. This allows each electrode to act on substantially different regions across the width of the substrate, by applying different potentials to each region in order to etch a desired, arbitrary pattern.

SUMMARY OF THE INVENTION

In accordance with the preferred embodiment, the invention provides an electro-chemical etch device for selectively removing material from an electrically conductive surface. The device comprises an electrically conductive fluid, with at least two electrodes aligned across the surface, each electrode being proximate to a corresponding one of an equal number of regions of the surface. The electrodes are each at least partially immersed in the fluid. Surface movement means are provided for moving the surface through the fluid, transversely to the cross-web direction of alignment of the electrodes. A suitable control means is electrically coupled between the electrodes and the surface for controlling electrical current flow into or out of the fluid at each of the electrodes in synchronization with movement of the surface. The conductive surface and the conductive fluid are selected such that the rate of material removal at any point on the conductive surface is substantially dependent upon the surface density of electrical current flow into or out of the fluid at that point.

Preferably, an electrically insulating means is associated with the electrodes. The insulating means is placed in close proximity to the conductive surface at points adjacent to the electrodes; but is not present at points between the electrodes and the surface.

Advantageously, the electrodes may comprise a plurality of linearly aligned electrodes oriented perpendicular to the conductive surface.

The control means may also be capable of selectively applying positive or negative voltages to selected ones of the electrodes at selected times, thereby selectively preventing the removal of material proximate to the positively charged electrodes, while facilitating the removal of material proximate to the negatively charged electrodes.

The surface may be a thin film supported by a substrate, the substrate being substantially immune to electro-chemical or chemical etching. The thin film and the substrate may be formed as a spiral roll.

DETAILED DESCRIPTION OF THE PREFERRED EMBODIMENT SCIENTIFIC BACKGROUND

Figure 1:
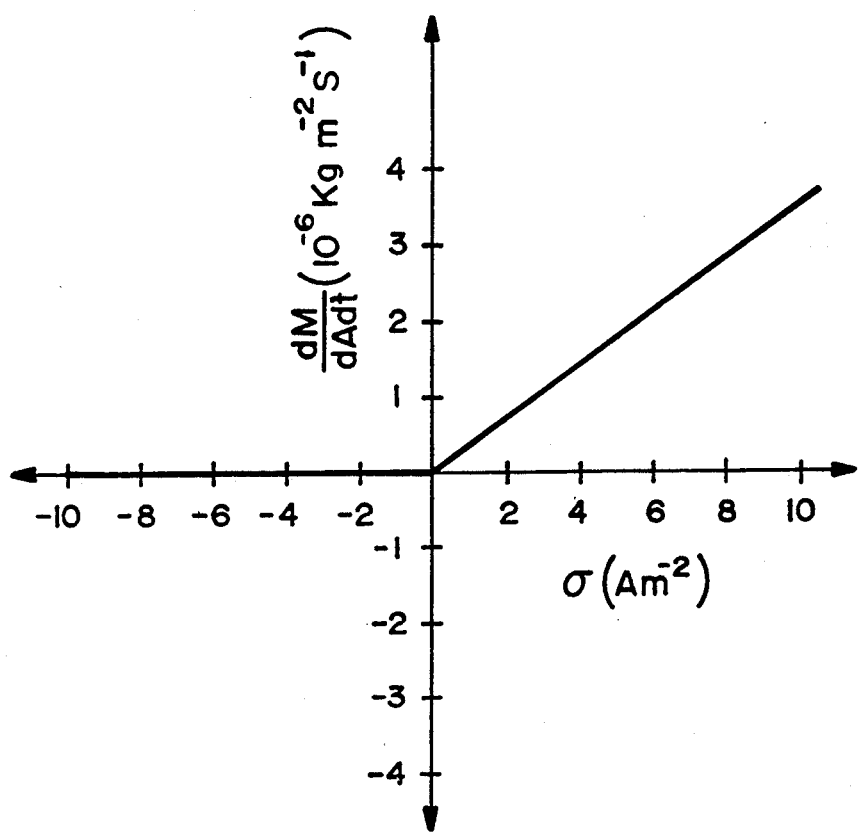
FIG. 1 is a graph on which mass removal rate per unit area is plotted as the ordinate, versus surface current density for metallic copper immersed in a 0.1M $H_2SO_4$ solution.

It is appropriate to review some aspects of the phenomenon known as electro-chemical etching. It is well known that many electrically conductive solid materials can be dissolved into an electrically conductive solution, if electrical current is caused to flow between the materials and the solution. Even without the flow of electrical current, it is generally the case that a material immersed in a solution will dissolve into the solution at some rate. But, in the presence of electrical current this rate can be substantially increased. For example, the electro-chemical etching phenomenon is responsible for various galvanic corrosion problems which affect metallic structures immersed in sea water, which is a conductive fluid. The phenomenon is also employed in various electro-chemical etch procedures, where it is desirable to dissolve away conductive solid materials at higher rates than would otherwise be possible for non-electro-chemical dissolving of the material at comparable temperatures and with comparable concentrations of chemical in the dissolving solution. This procedure can also be useful in that an underlying surface exposed by the electro-chemical dissolution of overlying surface material can, under the right circumstances, have useful properties such as being particularly smooth, exposing crystal defects, etc.

In typical uses of electro-chemical etching, it is of course necessary to provide a complete circuit for the flow of electric current. The circuit generally consists of a power supply, one terminal of which is connected to the conductive material which is to be electro-chemically etched, and the other terminal of which is connected to an electrode whose only purpose is to complete the circuit. The conductive material and the electrode are both immersed in the chosen conductive fluid. In this context, it has become common to discuss the nature of the electro-chemical etching in terms of the voltage applied by the power supply, the current passing through the circuit, and/or the average current density on the surface of the conductive material being etched. For such a simple system, any of these measures can be used, with little confusion, but in the context of the present invention it is useful to be much more specific in characterizing the electro-chemical removal process, as discussed below.

The overall circuit, and indeed the overall physical geometry of the electrodes, have only an indirect bearing on the electro-chemical etch process. At any given point on the surface of the conductive material being etched, the only directly relevant parameters are the concentration of the chemical constituents of the solution adjacent to the conductive surface at the point in question; and, the magnitude and direction of the surface density of electrical current flowing between the conductive surface and the conductive fluid at that point. Of course, the overall geometry of the system and the external circuitry are important determinants of the surface current density at any particular point, but they are not directly responsible for the removal of material. In other words, two different systems could have very different external circuits, currents, voltages, and physical geometry; yet, if they had the same surface current and the same fluid chemistry at two specified points of interest, then material removal would occur at the same rate at both of these points.

There are many materials and conductive fluids which exhibit substantial electro-chemical etching dependent on surface current density. The most common examples are various common metals immersed in common electrolyte solutions. FIG. 1 shows a typical result for metallic copper immersed in a weak acid. When current flows in the positive direction (that is, flow of conventional positive charge out of the metal and into the solution), the dominant electro-chemical reaction is the conversion of copper atoms to positive copper ions, with the liberation of two electrons per atom, with the ions going into solution in the conductive fluid. This results in a direct proportionality between the mass removal rate per unit area and the surface current density, given by $$dM/dAdt = m_1/N_v e\sigma$$

where M is the mass of removed material, A is area, $M_a$ is the mass of the dissolving metal atoms, $N_v$ is the valence of the dissolved metal ions, e is the electronic charge, and $\sigma$ is the surface current density.

For negative current, there is very little mass removal; the dominant electro-chemical reaction being the conversion of positive hydrogen ions to hydrogen gas, with the acceptance of electrons from the conductive surface. It is significant that the behaviour illustrated in FIG. 1 is only very weakly dependent upon the nature of the conductive fluid. Provided that the conductive fluid is not so concentrated that substantial dissolving of the conductive material would occur even without current flow, and further provided that the fluid does not contain any positive ion species which upon acceptance of an electron would plate out on the surface in the case of negative currents, then the removal rate is relatively independent of the fluid chemistry. Of course, variations in the chemical constituents of the fluid will affect the electrical conductivity of the fluid, and will therefore impact the voltage requirements and geometrical requirements for achieving a specific surface current density. This is why it is more convenient to discuss electro-chemical etching in terms of surface current density at any given point.

The rate of dissolution is so dependent on surface current density that a large amount of etching can occur with positive currents, while virtually no etching will occur with zero current or negative currents. As described below, this property makes it possible to achieve a very high degree of selectivity in the rate of removal of surface material by suitable geometrical configuration of the electrodes giving rise to the surface currents.

In the case of positive currents, some metallic materials such as copper will dissolve readily, whereas others will not undergo any substantial degree of etching. For such materials, the dominant electro-chemical reaction results in the neutralization of OH. ions and the release of oxygen gas. Platinum is an example of such a metal; it is virtually immune to electro-chemical etching in most electrolytes.

Restricting the Etched Region

(a) Electrode With Surrounding Insulator

In order to achieve a high degree of selectivity in the electro-chemical etching caused by conductive fluid-immersed, current-carrying electrodes placed proximate to the conductive surface to be etched, there must be a method of restricting to a sharply defined region the etching associated with a given electrode. One such method is to surround all but the tip of the electrode with insulating material and then place the exposed electrode tip in near contact with the conductive surface, so that all current flow must necessarily occur adjacent to the electrode. This approach is impractical for a number of reasons. First, there is a risk of metallic contact between the electrode tip and the conductive surface, which would cause large undesirable currents to flow. Second, due to the inherent inaccuracies to which the electrode tip could be mechanically positioned, the actual quantity of current flowing for a given applied voltage would be quite variable and unpredictable because the fractional variation in the separation between the electrode and the conductive surface would necessarily be large. Third, gas bubbles created by the electro-chemical reactions with one or more electrodes could be trapped by the close physical proximity of the electrode to the conductive surface, driving out the conductive fluid, and interfering with the electro-chemical etch process in a very inconsistent way. It is therefore desirable to have a physical separation between the surface and the electrode, which is substantially in excess of the inherent positioning errors of the system. This would typically result in diffused regions of electro-chemical etching, which would generally be unacceptable for creating the desired pattern.

(b) Electrode With Adjacent Insulator

Figure 2:
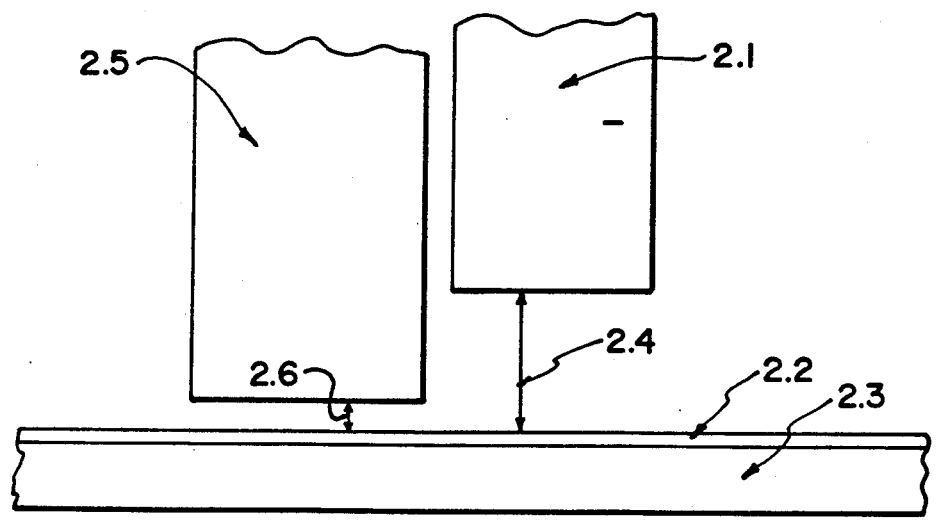
FIG. 2 illustrates the manner in which an insulator may be positioned adjacent an electrode to restrict the physical extent of the electro-chemical etching associated with the electrode.
Figure 3:
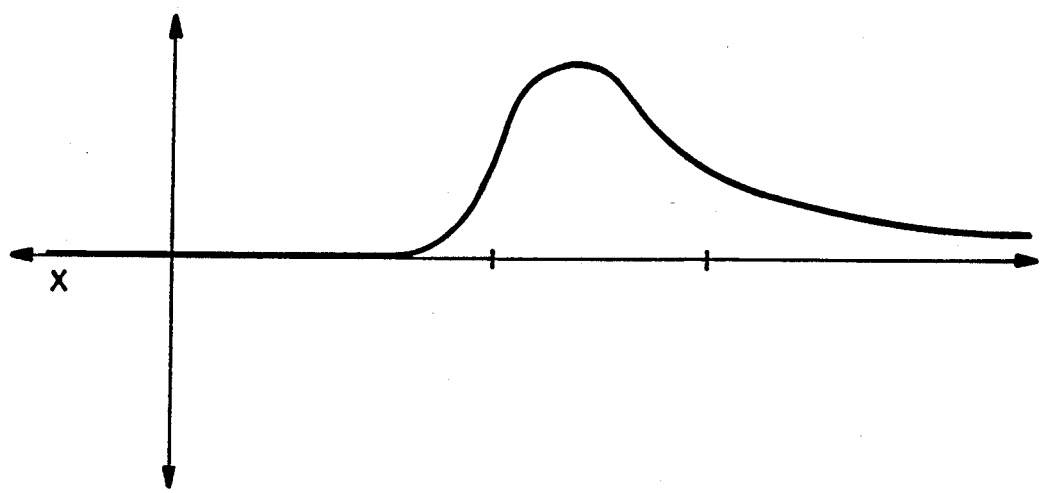
FIG. 3 is a graph on which the rate of electro-chemical etching is plotted as the ordinate, versus position, for the configuration depicted in FIG. 2.

FIG. 2 depicts an alternative method of restricting the electro-chemical etch effect associated with an electrode. Electrode 2.1 is positioned a distance 2.4 above conductive surface 2.2, which overlies non-conductive support substrate 2.3. Insulator 2.5 is located to the left side of electrode 2.1 and extends to within close proximity of conductive surface 2.2. As shown in FIG. 3, which plots the rate of electro-chemical etching versus position for the configuration shown in FIG. 2, the effect of insulator 2.5 adjacent electrode 2.1 is to substantially reduce the physical extent of the electro-chemical etch effect associated with electrode 2.1. As can be seen in FIG. 3, on the right side of electrode 2.1, where no insulator is present, the diminishment of etch rate as a function of position is very gradual and a substantial amount of etching occurs, even at great distances. However, on the left or insulated side of electrode 2.1, the diminishment of etch rate as a function of position is very rapid and there is essentially zero etching effect at distances substantially removed from the electrode.

(c) Variable Potential Electrode

Figure 4:
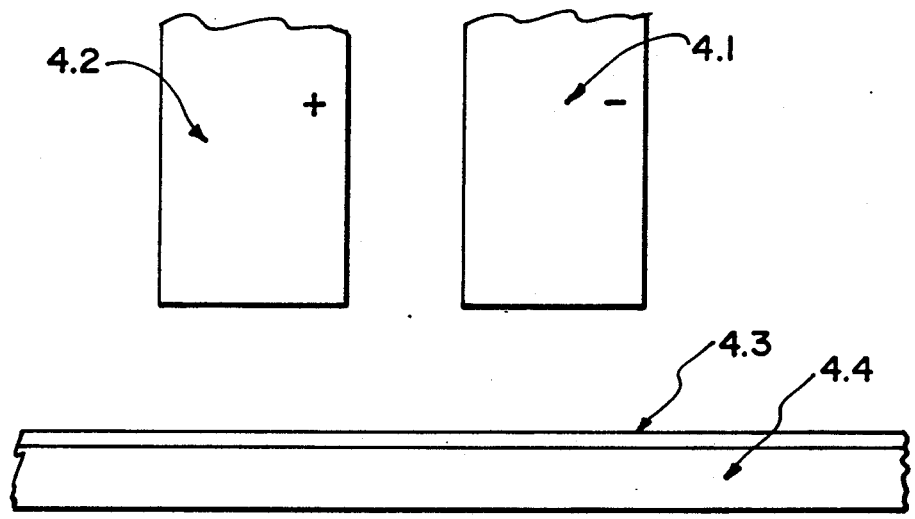
FIG. 4 depicts an alternative means for restricting the physical extent of the etching effect of a given electrode.
Figure 5:
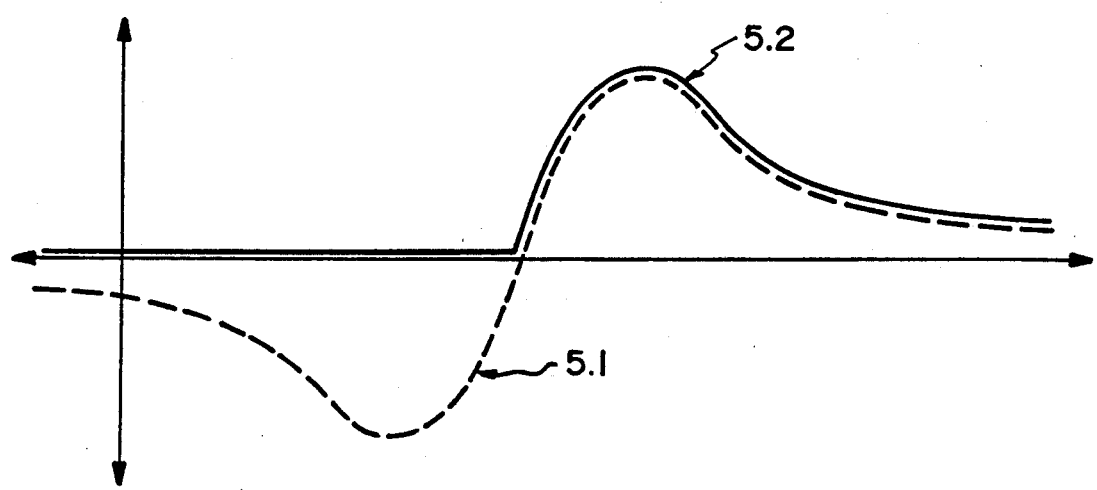
FIG. 5 is a graph on which surface current density and the rate of electro-chemical etching are plotted as the ordinates, versus position, for the configuration depicted in FIG. 4.

While the foregoing method of physically restricting the extent of electro-chemical etch effect associated with a given electrode has considerable merit, in certain circumstances it can be difficult to provide an appropriately shaped insulator. For example, in a configuration consisting of a large number of electrodes spaced very closely in a row, it can be very challenging to provide an insulator which is sufficiently accurate to provide the desired degree of selectivity. FIG. 4 depicts an alternate configuration for providing a sharp boundary to the physical extent of the electro-chemical etching associated with a given electrode. Electrode 4.1 has a negative potential applied relative to conductive surface 4.3 overlying substrate 4.4; whereas electrode 4.2 has a positive potential. FIG. 5 plots the surface current density (dashed line 5.1) and the resultant etch rate (solid line 5.2) as a function of position on conductive surface 4.3. As shown in FIG. 5, the surface current density plot 5.1 is negative in the vicinity of positive electrode 4.2 and is positive in the vicinity of negative electrode 4.1. Note that in regions of negative current density plot 5.2 shows that there is no electro-chemical etching effect. Therefore, the transition from positive current density to negative current density which occurs very abruptly between the two electrodes corresponds to a very abrupt curtailment of the electro-chemical etch effect at this transition point. Thus, without physical insulators in close proximity to the surface it is nevertheless possible to achieve a very well defined region of electro-chemical etch effect.

(d) Linearly Aligned Electrode Array

Figure 6:
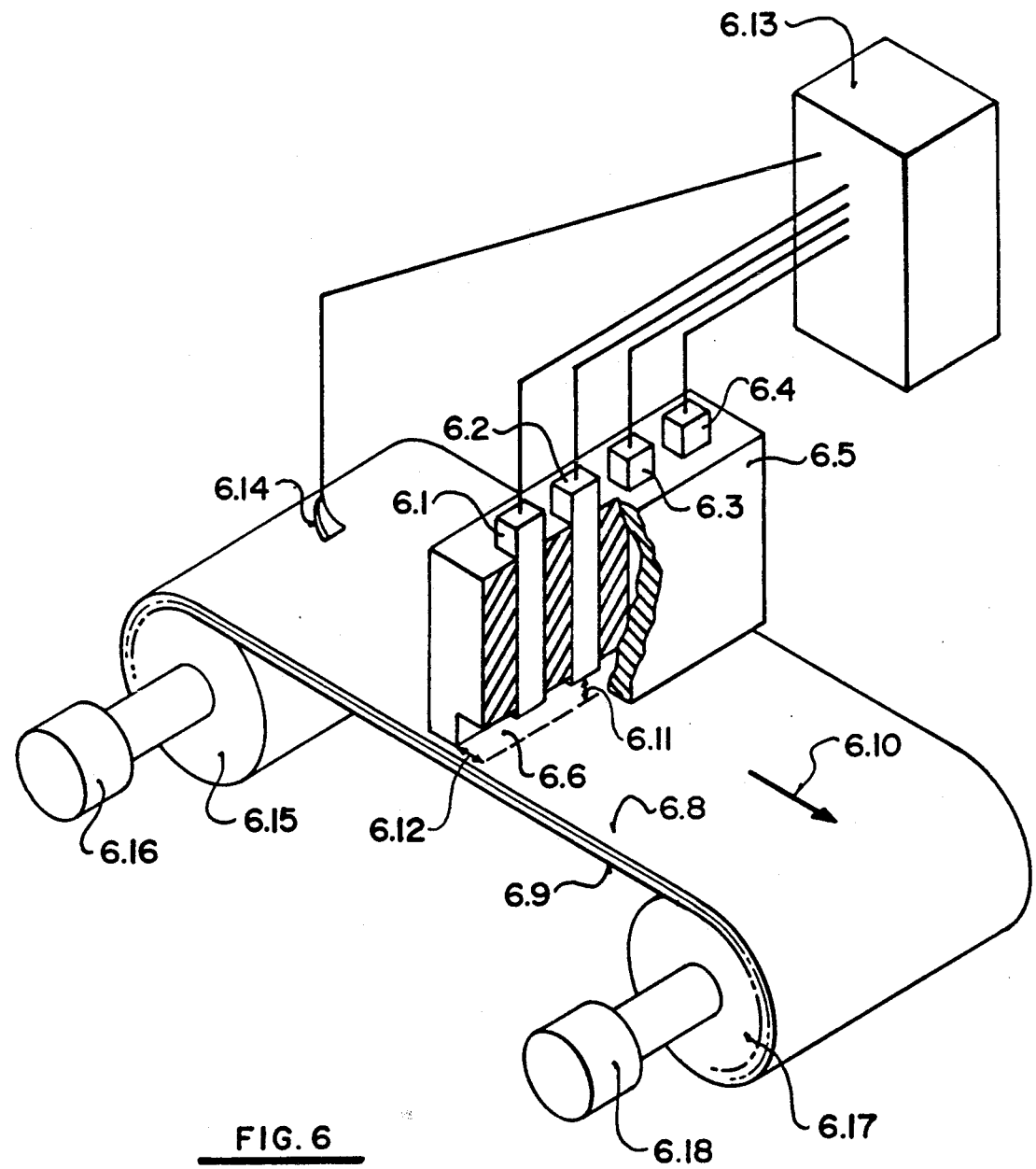
FIG. 6 illustrates an electro-chemical etch device according to the preferred embodiment of the invention.

FIG. 6 depicts the preferred embodiment of an electro-chemical etch device which incorporates the foregoing concepts. Electrodes 6.1, 6.2, 6.3 and 6.4 are exemplary of an arbitrarily large plurality of linearly aligned etching electrodes. Each electrode is connected to a "control means" such as programmable computer 6.13 capable of selectively applying a pre-defined positive or negative voltage or current to each individual electrode with respect to conductive surface 6.8, thereby controlling the electrical current flow into or out of the conductive fluid at each individual electrode. Wiper 6.14 completes the electrical circuit from the computer, through the electrodes, conducting fluid and conducting surface back to the computer.

The electrodes are insulated from one another over most of their length by embedding them within insulating material 6.5. The exposed bottom surfaces of the electrodes are located a distance 6.11 above conductive surface 6.8 which is supported by an underlying insulating substrate 6.9. The electrodes, insulator, substrate and conductive surface are immersed in a conducting fluid (not shown). Substrate 6.9 and conductive surface 6.8 move in the direction of arrow 6.10 (i.e. transversely to the direction in which the electrodes are aligned across surface 6.8). Surface 6.8 and substrate 6.9 may be wound in spiral fashion upon a feed roll 6.15. Clutch 6.16 controls the tension of the material wound upon feed roll 6.15. The material is withdrawn from feed roll 6.15 for passage, in the direction of arrow 6.10, adjacent the electrode array, following which the etched material is rewound upon take-up spool 6.17 which is driven by a suitable speed controlled motor 6.18. Feed roll 6.15, clutch 6.16, take-up spool 6.17 and motor 6.18 constitute one possible form of "surface movement means" for moving surface 6.8 past the electrode array.

The "up-web" side of the electrodes is defined as the side of the electrodes closest to the non-etched segment of substrate 6.9 and surface 6.8 (i.e. the side farthest from the viewer in FIG. 6); and, the "down-web" side of the electrodes is defined as the side of the electrodes closest to the etched segment of substrate 6.9 and surface 6.8 (i.e. the side closest to the viewer in FIG. 6). The term "cross-web" refers to the direction in which the electrodes extend across surface 6.8 and substrate 6.9. It will be noted that the cross-web direction in which the electrodes are aligned is transverse to the direction 6.10 of movement of surface 6.8 and substrate 6.9.

On both the up-web and down-web sides of the electrodes, the bottom surface of insulator 6.5 is in close proximity to conducting layer 6.8, so as to restrict the electro-chemical etch effect of electrodes from spreading in the up-web or down-web directions. However, over a width 6.12, corresponding to the width of the electrodes, the bottom surface of insulator 6.5 terminates in close proximity to the bottom surface of the electrodes so as to create a horizontal channel 6.6 which is perpendicular to the direction of arrow 6.10. Because of the electrical conductivity of the fluid, and because of the existence of channel 6.6, the electro-chemical etching effect of a given electrode taken by itself would spread in the perpendicular direction by an amount in excess of the distance between individual electrodes. Thus, if a voltage which is negative with respect to conductive surface 6.8 is applied to all of the electrodes, electro-chemical etching will occur along the entire length of channel 6.6. With the specific conductive fluid and a specific applied voltage, in specific selected dimensions, there will be a particular time required to achieve complete removal of conductive surface material 6.8 throughout channel 6.6. Provided that the motion of surface 6.8 and substrate 6.9 is slow enough that the material remains within channel 6.6 for a longer period of time than that required to remove the conductive material, the result will be complete removal of all of the conductive surface material 6.8. This ability to remove all conductive material would be difficult to obtain if physical insulating barriers were positioned between the individual electrodes of FIG. 6.

Of course, it will generally be desirable to stop etching from occurring underneath specific electrodes at specific times, in order to cause a specific pattern of conductive material to remain behind after the material passes the electrodes. This may be achieved at any time for any electrode by suitably programming the controller to render the appropriate electrode(s) positive rather than negative for the appropriate time interval. As described previously, the region of conductive surface beneath a positively charged electrode exhibits negative current density which generally will prevent electro-chemical etching from occurring in that region. Furthermore, also as described previously, the transition from positive surface current beneath a negative electrode to negative surface current beneath a positive electrode occurs rather abruptly, which provides a very well defined limit to the physical extent of the etch effect associated with any given negatively charged electrode.

As will be apparent to those skilled in the art in the light of the foregoing disclosure, many alterations and modifications are possible in the practice of this invention without departing from the spirit or scope thereof. In constructing a device based upon the foregoing principles, those skilled in the art may adopt a variety of known design features for electro-chemical systems. For example, it is highly desirable to cause the conductive fluid to flow through channel 6.6 at a sufficient velocity to remove gas bubbles generated by the electro-chemical process. In addition, if the flowing fluid is to be recirculated, it may be necessary to chemically remove metal ions present in solution as a result of the electro-chemical etching, in order to prevent them from plating out to a considerable extent on the negatively charged electrodes. Additionally, heat generated by the electrical energy dissipation in the system should be removed so that the system temperature does not rise to unacceptable levels. Furthermore, some care should be taken with the mechanism used to move substrate 6.9 and surface 6.8, in order to ensure that such movement occurs smoothly and accurately, so that the resultant electro-chemical etching is consistent and accurate. The controller must also be able to individually adjust the voltage applied to each electrode sufficiently quickly that the electrodes may all be adapted to the voltages required to create the desired etch effect at the appropriate times. The scope of the invention is accordingly to be construed in accordance with the substance defined by the following claims.

I claim:

1. An electro-chemical etch device for selectively removing material from an electrically conductive surface, said device comprising:
   (a) an electrically conductive fluid;
   (b) at least two electrodes aligned across said surface, each of said electrodes at least partially immersed in said fluid, and each proximate to a corresponding one of an equal number of regions of said surface;
   (c) surface movement means for moving said surface through said fluid, transversely to said direction of alignment of said electrodes; and,
   (d) control means electrically coupled between said electrodes and said surface for controlling electrical current flow into or out of said fluid at each of said electrodes in synchronization with said surface movement;
   wherein said conductive surface and said conductive fluid are selected such that the rate of material removal at any point on said conductive surface is substantially dependent upon the surface density of electrical current flow into or out of said fluid at said point.

2. An electro-chemical etch device as defined in claim 1, further comprising insulating means associated with said electrodes, said insulating means being:
   (a) in close proximity to said surface at points adjacent to said electrodes; and,
   (b) removed from points between said electrodes and said surface.

3. An electro-chemical etch device as defined in claim 1, wherein said electrodes further comprise a plurality of linearly aligned electrodes oriented perpendicular to said surface.

4. An electro-chemical etch device as defined in claim 1, wherein said control means is further for selectively applying positive or negative voltages to selected ones of said electrodes at selected times, thereby selectively preventing said material removal proximate to said positively charged electrodes, while facilitating said material removal proximate to said negatively charged electrodes.

5. An electro-chemical etch device as defined in claim 1, wherein said surface is a thin film supported by a substrate, said substrate being substantially immune to electro-chemical or chemical etching.

6. An electro-chemical etch device as defined in claim 5, wherein said thin film and said substrate are configured as a spiral roll.

7. An electro-chemical etch device as defined in claim 2, wherein said electrodes further comprise a plurality of linearly aligned electrodes oriented perpendicular to said surface.

8. An electro-chemical etch device as defined in claim 4, wherein said electrodes further comprise a plurality of linearly aligned electrodes oriented perpendicular to said surface.

9. An electro-chemical etch device as defined in claim 5, wherein said electrodes further comprise a plurality of linearly aligned electrodes oriented perpendicular to said surface.

10. An electro-chemical etch device as defined in claim 2, wherein said control means is further for selectively applying positive or negative voltages to selected ones of said electrodes at selected times, thereby selectively preventing said material removal proximate to said positively charged electrodes, while facilitating said material removal proximate to said negatively charged electrodes.

11. An electro-chemical etch device as defined in claim 5, wherein said control means is further for selectively applying positive or negative voltages to selected ones of said electrodes at selected times, thereby selectively preventing said material removal proximate to said positively charged electrodes, while facilitating said material removal proximate to said negatively charged electrodes.

12. An electro-chemical etch device as defined in claim 2, wherein said surface is a thin film supported by a substrate, said substrate being substantially immune to electro-chemical or chemical etching.

13. An electro-chemical etch device as defined in claim 7, wherein said control means is further for selectively applying positive or negative voltages to selected ones of said electrodes at selected times, thereby selectively preventing said material removal proximate to said positively charged electrodes, while facilitating said material removal proximate to said negatively charged electrodes.

14. An electro-chemical etch device as defined in claim 9, wherein said control means is further for selectively applying positive or negative voltages to selected ones of said electrodes at selected times, thereby selectively preventing said material removal proximate to said positively charged electrodes, while facilitating said material removal proximate to said negatively charged electrodes.

15. An electro-chemical etch device as defined in claim 9, further comprising insulating means associated with said electrodes, said insulating means being:
   (a) in close proximity to said surface at points adjacent to said electrodes; and,
   (b) removed from points between said electrodes and said surface.

16. An electro-chemical etch device as defined in claim 11, further comprising insulating means associated with said electrodes, said insulating means being:
   (a) in close proximity to said surface at points adjacent to said electrodes; and,
   (b) removed from points between said electrodes and said surface.

17. An electro-chemical etch device as defined in claim 13, wherein said surface is a thin film supported by a substrate, said substrate being substantially immune to electro-chemical or chemical etching.

18. A method of selectively removing material from an electrically conductive surface, said method comprising the steps of:
   (a) immersing said surface in an electrically conductive fluid;
   (b) aligning at least two electrodes across said surface, with each electrode proximate to a corresponding one of an equal number of regions of said surface;
   (c) at least partially immersing each of said electrodes in said fluid;
   (d) moving said said surface through said fluid, transversely to said direction of alignment of said electrodes; and,
   (e) controlling electrical current flow into or out of said fluid at each of said electrodes in synchronization with said surface movement.

19. A method as defined in claim 18, further comprising insulating each of said electrodes at points in close proximity to said surface and adjacent to said electrodes, but not at points between said electrodes and said surface.

20. A method as defined in claim 19, wherein said controlling step further comprises selectively applying positive or negative voltages to selected ones of said electrodes at selected times, thereby selectively preventing said material removal proximate to said positively charged electrodes, while facilitating said material removal proximate to said negatively charged electrodes.

21. A method as defined in claim 18, wherein said surface is a thin film supported by a substrate, said substrate being substantially immune to electro-chemical or chemical etching.

22. A method as defined in claim 18, wherein said aligning step further comprises linearly aligning said electrodes across said surface and orienting said electrodes perpendicular to said surface.

* * * * *